(12) United States Patent
Zhang et al.

(10) Patent No.: US 11,664,460 B2
(45) Date of Patent: May 30, 2023

(54) THIN-FILM TRANSISTOR AND METHOD FOR PREPARING THE SAME, DISPLAY SUBSTRATE AND DISPLAY DEVICE

(71) Applicant: BOE TECHNOLOGY GROUP CO., LTD., Beijing (CN)

(72) Inventors: Wenlin Zhang, Beijing (CN); Jianming Sun, Beijing (CN); Hehe Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 134 days.

(21) Appl. No.: 16/608,549

(22) PCT Filed: Apr. 25, 2019

(86) PCT No.: PCT/CN2019/084226
§ 371 (c)(1),
(2) Date: Oct. 25, 2019

(87) PCT Pub. No.: WO2019/214440
PCT Pub. Date: Nov. 14, 2019

(65) Prior Publication Data
US 2020/0220020 A1   Jul. 9, 2020

(30) Foreign Application Priority Data
May 11, 2018 (CN) .......................... 201810450327.7

(51) Int. Cl.
*H01L 29/786* (2006.01)
*H01L 27/12* (2006.01)

(52) U.S. Cl.
CPC ...... *H01L 29/7869* (2013.01); *H01L 27/1285* (2013.01); *H01L 29/78618* (2013.01)

(58) Field of Classification Search
CPC .......... H01L 27/1285; H01L 29/78618; H01L 29/7869
See application file for complete search history.

(56) References Cited

U.S. PATENT DOCUMENTS

| | | | | |
|---|---|---|---|---|
| 7,977,675 B2* | 7/2011 | Kawamura | ......... | H01L 27/1214 257/43 |
| 8,368,067 B2* | 2/2013 | Uchiyama | ......... | H01L 29/40111 257/43 |

(Continued)

FOREIGN PATENT DOCUMENTS

| | | |
|---|---|---|
| CN | 102160184 A | 8/2011 |
| CN | 102460712 A | 5/2012 |

(Continued)

OTHER PUBLICATIONS

Office Action of CN Application No. 201810450327.7, dated Mar. 17, 2020, 8 pages.

(Continued)

*Primary Examiner* — Jay C Kim
(74) *Attorney, Agent, or Firm* — Muncy, Geissler, Olds & Lowe, P.C.

(57) ABSTRACT

The present disclosure relates to a thin-film transistor, a method for preparing the same, and a display substrate. The method for preparing the thin-film transistor includes the steps of forming a source electrode, a drain electrode, and an active layer, in which the step of forming the source electrode, the drain electrode, and the active layer includes: forming a first thin film from a first metal oxide material in an atmosphere of a first oxygen content; and forming a second thin film from a second metal oxide material in an atmosphere of a second oxygen content, in which the first thin film is configured to form the active layer, the second thin film is configured to form a source electrode and a drain (Continued)

electrode, and the second oxygen content is less than the first oxygen content.

8 Claims, 8 Drawing Sheets

(56) References Cited

U.S. PATENT DOCUMENTS

| | | | | |
|---|---|---|---|---|
| 8,377,744 | B2* | 2/2013 | Yamazaki | H01L 21/465 |
| | | | | 438/104 |
| 9,171,942 | B2* | 10/2015 | Mochizuki | H01L 27/1225 |
| 9,666,719 | B2* | 5/2017 | Yamazaki | H01L 29/66969 |
| 9,905,697 | B2* | 2/2018 | Kao | H01L 29/66969 |
| 10,840,380 | B2* | 11/2020 | Ye | H01L 29/42364 |
| 2010/0025680 | A1 | 2/2010 | Shino et al. | |
| 2010/0072468 | A1 | 3/2010 | Yamazaki et al. | |
| 2011/0133179 | A1* | 6/2011 | Yamazaki | H01L 21/3003 |
| | | | | 257/E21.409 |
| 2012/0037897 | A1 | 2/2012 | Shiino et al. | |
| 2012/0252173 | A1 | 10/2012 | Imoto et al. | |
| 2013/0048994 | A1* | 2/2013 | Choi | H01L 29/45 |
| | | | | 257/E21.409 |
| 2014/0197408 | A1 | 7/2014 | Tsuruma et al. | |
| 2016/0027887 | A1 | 1/2016 | Yuan et al. | |
| 2017/0084458 | A1* | 3/2017 | Ye | H01L 29/78696 |
| 2019/0157429 | A1* | 5/2019 | Jiang | H01L 21/02488 |

FOREIGN PATENT DOCUMENTS

| | | |
|---|---|---|
| CN | 103745978 A | 4/2014 |
| CN | 103765596 A | 4/2014 |
| CN | 108766972 A | 11/2018 |

OTHER PUBLICATIONS

International Search Report of PCT/CN2018/084226, dated Jul. 30, 2019, 13 pages.

* cited by examiner

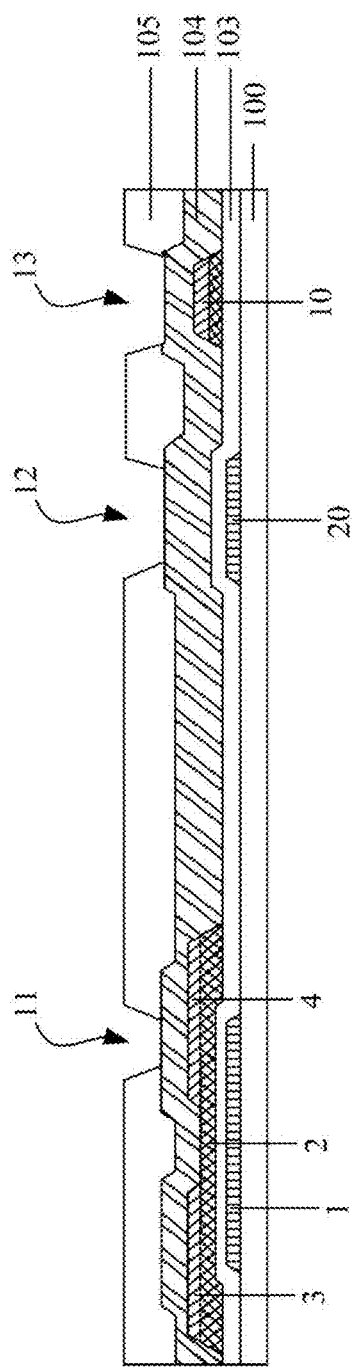
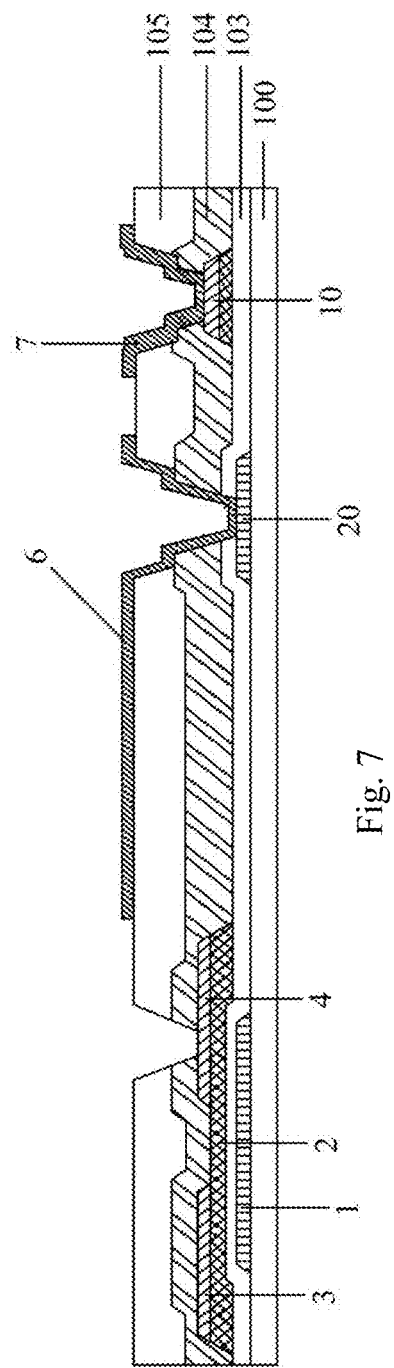
Fig. 6
Fig. 7

THIN-FILM TRANSISTOR AND METHOD FOR PREPARING THE SAME, DISPLAY SUBSTRATE AND DISPLAY DEVICE

CROSS-REFERENCE TO RELATED APPLICATION

The present application is a National Stage of PCT Application No. PCT/CN2019/084226 filed on Apr. 25, 2019, which of claims a priority of the Chinese Patent Application No. 201810450327.7 filed on May 11, 2018, which are incorporated herein by reference in their entirety.

TECHNICAL FIELD

The present disclosure relates to the field of display technology, in particular, to a thin-film transistor and a method for preparing the same, a display substrate and a display device including the same.

BACKGROUND

Metal oxide materials are increasingly used in thin-film transistors due to their high mobility. However, in the existing mass production technology of display products, metal oxide materials are difficult to replace conductive materials, such as metal materials and transparent conductive materials, due to their conductivity problems. Moreover, the steps of preparing the metal electrode and the transparent electrode are required to be performed in separate film forming chambers, which will inevitably reduce production efficiency and increase production costs.

SUMMARY

In one aspect of the present disclosure, there is provided a method for preparing a thin-film transistor, including a step of forming a source electrode, a drain electrode, and an active layer, in which the step of forming the source electrode, the drain electrode, and the active layer includes: forming a first thin film from a first metal oxide material in an atmosphere of a first oxygen content; and forming a second thin film from a second metal oxide material in an atmosphere of a second oxygen content, in which the first thin film is configured to form the active layer, the second thin film is configured to form a source electrode and a drain electrode, and the second oxygen content is less than the first oxygen content.

In the method as described above, the step of forming the source electrode, the drain electrode, and the active layer further includes performing an annealing process on the second thin film at a second temperature.

In the method as described above, the second oxygen content is less than or equal to 30% (v/v).

In the method as described above, the second oxygen content is 30% (v/v), and the second thin film has a thickness greater than or equal to 700 Å.

In the method as described above, the second temperature ranges from 240° C. to 260° C.

In the method as described above, an H atom-containing gas is input to form the second thin film from the second metal oxide material in an atmosphere having the second oxygen content.

In the method as described above, water vapor is input to form the second thin film from the second metal oxide material in an oxygen-free atmosphere.

In the method as described above, the H atom-containing gas is one or more selected from the group consisting of water vapor and ammonia.

In the method as described above, the water vapor has an input rate greater than or equal to 1 sccm, and the second thin film has a thickness greater than or equal to 1400 Å.

In the method as described above, the step of forming the source electrode, the drain electrode, and the active layer further includes performing an annealing process on the first thin film at a first temperature.

In the method as described above, the first temperature ranges from 300° C. to 420° C.

In the method as described above, the first metal oxide material and the second metal oxide material are a same metal oxide material.

In the method as described above, the first thin film and the second thin film are formed in a same chamber and using a same target by a sputtering process.

In the method as described above, both the first metal oxide material and the second metal oxide material include a mixture of indium gallium tin oxide and indium oxide, and a molar content of indium in the first metal oxide material and the second metal oxide material is greater than or equal to 50 mol %.

In the method as described above, the step of forming the source electrode, the drain electrode, and the active layer further includes: forming the second thin film on the first thin film; and subjecting the first thin film and the second thin film to a single patterning process to form the source electrode, the drain electrode layer, and the active layer.

In the method as described above, the step of subjecting the first thin film and the second thin film to perform the single patterning process to form the source electrode, the drain electrode and the active layer includes: coating a photoresist on the second thin film, and exposing and developing the photoresist to form a photoresist completely reserved region, a photoresist partially reserved region, and a photoresist non-reserved region, in which the photoresist completely reserved region corresponds to a region where the source electrode and the drain electrode are located, the photoresist partially reserved region corresponds to a region between the source electrode and the drain electrode, and the photoresist non-reserved region corresponds to other regions; removing the first thin film and the second thin film of the photoresist non-reserved region; removing the photoresist on the photoresist partially reserved region by an ashing process, and then removing the second thin film on the photoresist partially reserved region; and stripping a remaining photoresist to form the active layer, the source electrode, and the drain electrode.

In another aspect of the present disclosure, there is provided a thin-film transistor prepared by the method as described above, including an active layer, a source electrode and a drain electrode, in which the source electrode and the drain electrode as well as the active layer are made of a same metal oxide material, the source electrode and the drain electrode have a square resistance less than $5 \times 10^2 \Omega/\square$, and an oxygen content in the metal oxide material after forming the source electrode and the drain electrode is at least 0.5% lower than the stoichiometric oxygen content of the metal oxide.

In the thin-film transistor as described above, both the first metal oxide material and the second metal oxide material include a mixture of indium gallium tin oxide and indium oxide, and a molar content of indium in the first metal oxide material and the second metal oxide material is greater than or equal to 75 mol %.

In the thin-film transistor as described above, the metal oxide material after forming the source electrode and the drain electrode contains 0.01% to 5% of H atom with respect to a total atomic number of the metal oxide.

In still another aspect of the present disclosure, there is provided a display substrate including the thin film transistor as described above.

In still another aspect of the present disclosure, there is provided a display device including the display substrate as described above.

BRIEF DESCRIPTION OF THE DRAWINGS

In order to illustrate the technical solutions in the embodiments of the present disclosure or the related art in a clearer manner, the drawings desired for the embodiments of present disclosure or the related art will be briefly hereinafter briefly. Obviously, the following drawings merely relate to some embodiments of the present disclosure. Based on these drawings, a person skilled in the art may obtain the other drawings or embodiments without any creative effort.

FIGS. 2 to 8 are schematic views showing a process for preparing a display substrate according to an embodiment of the present disclosure.

DETAILED DESCRIPTION

Figure 1:
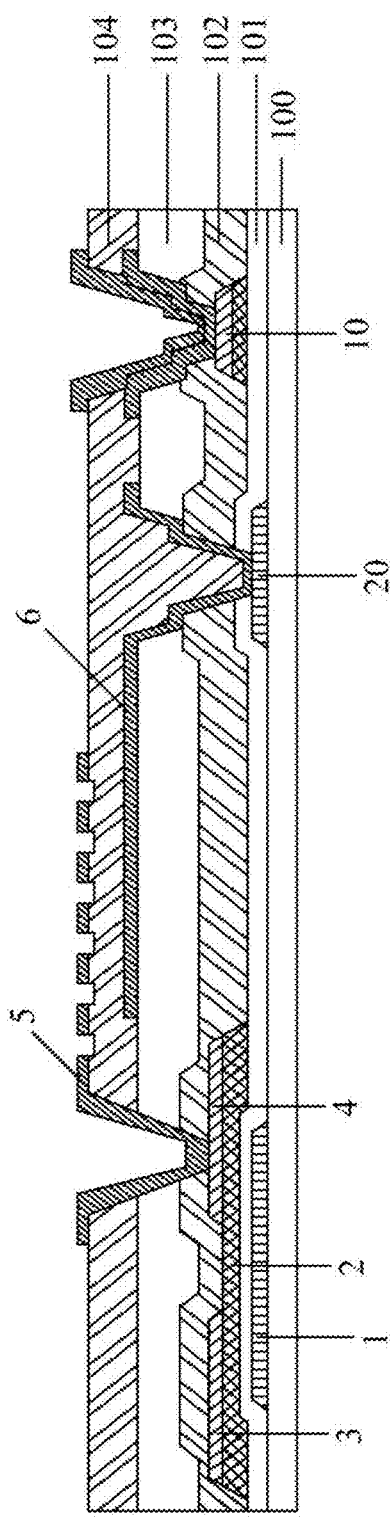
FIG. 1 is a schematic view showing a display substrate according to an embodiment of the present disclosure.

The features and principles of the present disclosure will be described in detail below in conjunction with drawings. The detailed description cited is merely used for explaining the present disclosure, rather than limiting the protection scope of the present disclosure.

Metal oxide materials are increasingly used in thin-film transistors due to their high mobility. However, metal oxides are difficult to replace metal materials as electrode materials due to their conductivity problems. This results in that the source electrode and the drain electrode of the thin-film transistor and the active layer is required to be prepared by different film forming chambers, which will reduce the production efficiency of the product and increase the production cost. In order to solve the above problems in the related art, the present disclosure provides a method for producing a thin-film transistor in a high productivity and from a metal oxide material, and a thin-film transistor, a display substrate, and a display device thus prepared.

According to an aspect of the present disclosure, the present disclosure provides a method for preparing a thin-film transistor, including step of forming a source electrode, a drain electrode, and an active layer, in which the step of forming the source electrode, the drain electrode, and the active layer includes: forming a first thin film from a first metal oxide material in an atmosphere of a first oxygen content; and forming a second thin film from a second metal oxide material in an atmosphere of a second oxygen content, in which the first thin film is configured to form an active layer pattern, the second thin film is configured to form a source electrode and a drain electrode, and the second oxygen content is less than the first oxygen content.

The above method of the present disclosure uses an atmosphere having a low oxygen content in the process of preparing the source electrode and the drain electrode, which reduces the oxygen content of the metal oxide material after the film formation. Thus, the sheet resistivity of the formed film can be reduced to satisfy the electrical conductivity requirements of the source electrode and the drain electrode. This makes it possible to prepare the source electrode and the drain electrode of the thin-film transistor from the metal oxide. Further, the source electrode and the drain electrode can be prepared from the same film forming chamber used by the active layer, thereby eliminating the separately provided film forming chambers for preparing the source electrode and the drain electrode. This increases production efficiency and reduces production cost.

The process for forming the first thin film and the second thin film may specifically include, but is not limited to, sputtering process, vapor deposition, evaporation, and the like. In view of controllability and workability of the film forming process, the process for forming the first thin film and the second thin film may be selected from sputtering process.

The first metal oxide material and the second metal oxide material may be a same material or different materials. In an embodiment of the present disclosure, both the first metal oxide material and the second metal oxide material include a mixture of indium gallium tin oxide and indium oxide. Optionally, in the process of forming the first thin film and the second thin film, it is only necessary to adjust the oxygen content, and it is not necessary to replace the target, thereby further improving the production efficiency. In addition, the second metal oxide material is selected to be a mixture including indium gallium tin oxide and indium oxide. Since the indium content in the mixture is high, the mobility of the film prepared from the second metal oxide material is higher, which is advantageous for obtaining a lower square resistance. Further, the conductivity performance requirements of the source electrode and the drain electrode are satisfied, thereby improving the performance of the thin-film transistor.

Figure 12:
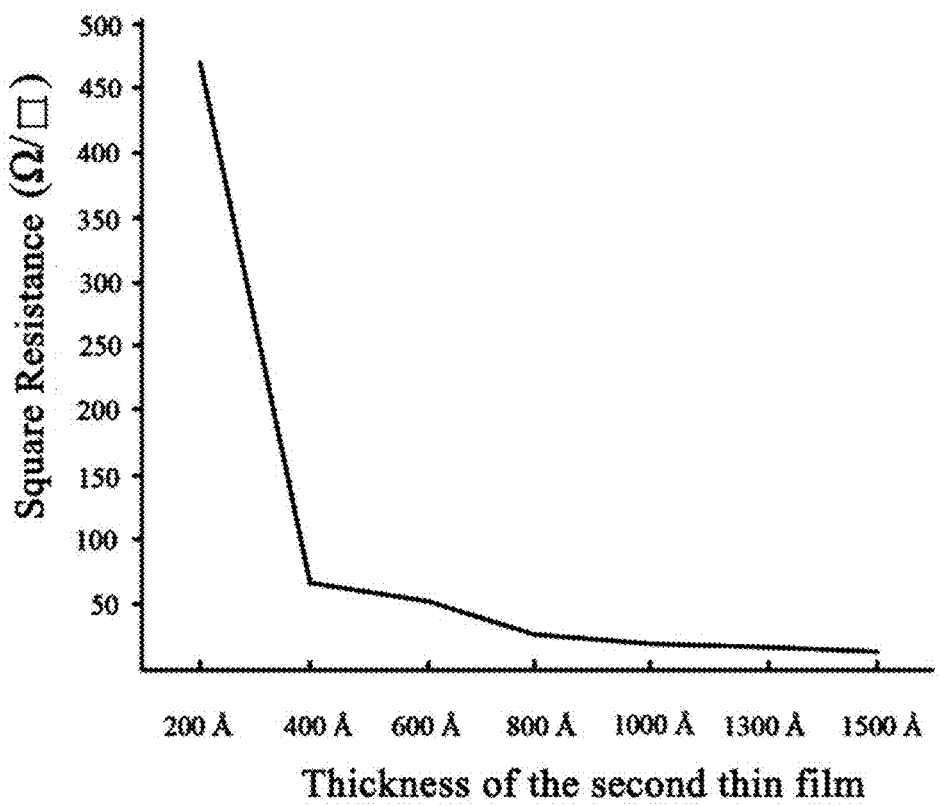
FIG. 12 is a graph showing the relationship between the thickness and the square resistance of the second thin film prepared when the molar content of indium in the mixture of indium gallium tin oxide and indium oxide is 75 mol % in an embodiment of the present disclosure.

By setting the molar content of indium in the mixture of indium gallium tin oxide and indium oxide to be greater than or equal to 50 mol % (based on the total molar amount of the metal in the mixture), it is more advantageous to obtain a lower square resistance, thereby allow the source electrode and the drain electrode to have a better electrical conductivity. For example, when the molar content of indium in the mixture of indium gallium tin oxide and indium oxide is 50 mol % and the thickness of the second thin film is greater than or equal to 700 Å, the square resistance of the second thin film may be on an order of magnitude of $10^2$ or less; and when the molar content of indium in the mixture of indium gallium tin oxide and indium oxide is 75 mol % and the thickness of the second thin film is greater than or equal to 800 Å, the square resistance of the second thin film may be on an order of magnitude of $0.3 \times 10^2$ or less. Such order of magnitude of square resistance can satisfy the resistance requirements of the source electrode and the drain electrode. As shown in FIG. 12, it shows the relationship between the thickness and the corresponding square resistance of the second thin film when the molar content of indium in the mixture of indium gallium tin oxide and indium oxide is 75 mol % in an embodiment of the present disclosure. As can be seen from FIG. 12, the larger the thickness of the second thin film is, the smaller the square resistance is. When the thickness of the second thin film is greater than or equal to 380 Å, the square resistance of the second thin film is on an order of magnitude of $10^2$ or less; and when the thickness is greater than 800 Å, the square resistance tends to decrease gently.

In the process of preparing the source electrode and the drain electrode, the lower the oxygen content of the second thin film after film formation, the better, that is, the lower the second oxygen content, the better. Since the lower the oxygen content is, the smaller the square resistance of the second thin film formed (i.e., the source electrode and the drain electrode) is, the conductivity performance requirements of the source electrode and the drain electrode can be better satisfied. Optionally, the second thin film formed has an oxygen content that is at least 0.5%, for example, at least 1%, 3%, 5%, 8%, 12%, 15%, or 20%, lower than the stoichiometric content. Optionally, the second thin film formed has a square resistance of $5 \times 10^2 \Omega/\square$ or less, for example, $1 \times 10^2 \Omega/\square$ or less, $0.8 \times 10^2 \Omega/\square$ or less, $0.5 \times 10^2 \Omega/\square$ or less, $0.3 \times 10^2 \Omega/\square$ or less, or $0.2 \times 10^2 \Omega/\square$ or less.

In an embodiment of the present disclosure, the second oxygen content is set to be less than or equal to 30% (volume ratio v/v), for example, the second oxygen content is 30 vol %, and the Ar gas content is 70 vol %. Optionally, the second oxygen content is set to be less than or equal to 25% (v/v), 20% (v/v), 15% (v/v), 10% (v/v), 5% (v/v), 3% (v/v), or 1% (v/v). Even optionally, the second oxygen content is set to be zero, i.e., the second thin film is prepared in an oxygen-free atmosphere. According to the findings of the inventors of the present disclosure, when the second thin film is prepared in an atmosphere having a second oxygen content of less than or equal to 30% (volume ratio v/v), a second thin film made from an oxygen-deficient metal oxide can be obtained.

In an embodiment of the present disclosure, the step of forming the source electrode, the drain electrode, and the active layer further includes performing an annealing process on the second thin film at a second temperature.

In the above steps, by subjecting the second thin film to an annealing process, the square resistance of the second thin film can be further adjusted to meet the conductive performance requirements of the source electrode and the drain electrode.

In the method according to the present disclosure, by adjusting one, two or three condition of the second oxygen content, the second temperature for the annealing process, and the thickness of the second thin film, the conductivity of the second thin film can satisfy the requirements of the source electrode and the drain electrode are, for example, a square resistance is $30\Omega/\square$ or less. When the second oxygen content is a specific value of the selectable range, by adjusting the second temperature, and/or the thickness of the second thin film, the conductivity of the second thin film can satisfy the requirements of the source electrode and the drain electrode.

Specifically, when the second oxygen content is 30%, the thickness of the second thin film is greater than or equal to 700 Å, the electrical conductivity (e.g., square resistance) requirements for the source electrode and the drain electrode can be satisfied. Further, when the second thin film is subjected to an annealing process and the second temperature is in the range of 240° C. to 260° C., the square resistance of the second thin film may be on an order of magnitude of $10^2$ or less, thereby further satisfying the conductivity requirements of the source electrode and the drain electrode. Optionally, the second temperature is 250° C. Obviously, the larger the thickness of the second thin film is, the smaller the square resistance is. The thickness of the second thin film may be set according to actual needs, and by adjusting the second oxygen content and the second temperature for the annealing process, the conductivity of the second thin film satisfies the conductive performance requirements of the source electrode and the drain electrode.

Optionally, the first thin film may be annealed at a first temperature. Optionally, the first temperature may be in the range of 300° C. to 420° C., which may reduce the defect state of the active layer and improve the stability of the TFT at the same time of allowing the first thin film to meet the square resistance requirement of the semiconductor.

In an optional embodiment of the present disclosure, an H atom-containing gas, such as water vapor and ammonia, may also be input to form the second thin film form the second metal oxide material in an atmosphere having the second oxygen content. For example, the amount of the gas containing H atoms is 2 vol % or less based on the total volume of the gas in the atmosphere. Optionally, the H atom-containing gas is a reducing H atom-containing gas. Since H atoms are introduced into the metal oxide, electrons will be introduced into the metal oxide, accordingly. Therefore, the carriers of the metal oxide material forming the second thin film are increased, thereby reducing the square resistance of the second thin film to satisfy the electrical conductivity requirements of the source electrode and the drain electrode.

In an optional embodiment, an H atom-containing gas may be input to form the second thin film from the second metal oxide material in an oxygen-free atmosphere. Optionally, the H atom-containing gas is water vapor. The preparation of the second thin film under an oxygen-free and water vapor containing atmosphere is more advantageous for realizing a second thin film having a smaller square resistance, thereby further improving the conductivity properties of the source electrode and the drain electrode. Optionally, the water vapor may be introduced at a speed greater than or equal to 1 sccm. Optionally, the thickness of the second thin film may be greater than or equal to 1400 Å. For example, when the atmosphere is water vapor, the amount of the input gas is 2 sccm, and it is possible to obtain a second thin film of 1400 Å to 2000 Å satisfying the performance requirement.

In an optional embodiment, the first thin film may be first formed and annealed, and then the second thin film is formed and then annealed. The first thin film and the second thin film may be respectively annealed at different temperatures, so as to obtain electrical conductivity, such as a square resistance value, that satisfies the requirements of the source electrode and the drain electrode as well as the active layer, respectively.

In the embodiment according to the present disclosure, by adjusting one, two or three conditions of the oxygen content, the thickness of the thin film, and the input rate of the water vapor, the source electrode and the drain electrode as well as the active layer can be simultaneously subjected to an annealing process at a same temperature, so that the source electrode and the drain electrode as well as the active layer satisfy respective conductivity performance requirements.

Optionally, the method according to the present disclosure may simultaneously form the source electrode, the drain electrode, and the active layer by a single patterning process, thereby further improving the production efficiency and reduce the production cost. Optionally, the step of forming the source electrode, the drain electrode, and the active layer include: forming the second thin film on the first thin film; and performing a single patterning process on the first thin film and the second thin film, to form a source electrode, a drain electrode and an active layer.

In an optional embodiment, the step of subjecting the first thin film and the second thin film to perform the single patterning process to form the source electrode, the drain electrode and the active layer may specifically include: coating a photoresist on the second thin film, and exposing and developing the photoresist to form a photoresist completely reserved region, a photoresist partially reserved region, and a photoresist non-reserved region, in which the photoresist completely reserved region corresponds to a region where the source electrode and the drain electrode are located, the photoresist partially reserved region corresponds to a region between the source electrode and the drain electrode, and the photoresist non-reserved region corresponds to other regions; removing the first thin film and the second thin film of the photoresist non-reserved region; removing the photoresist on the photoresist reserved region by an ashing process, and then removing the second thin film on the photoresist reserved region; and stripping a remaining photoresist to form the active layer pattern, the source electrode, and the drain electrode.

According to another aspect of the present disclosure, the present disclosure also provides a thin-film transistor prepared by the above method. The thin-film transistor includes an active layer, a source electrode and a drain electrode, in which the source electrode and the drain electrode as well as the active layer are made of a same metal oxide material, the source electrode and the drain electrode have a square resistance less than $1\times10^2 \Omega/\square$. Optionally, the source electrode and the drain electrode have a square resistance of $0.8\times10^2 \Omega/\square$ or less, $0.5\times10^2\ \Omega/\square$, $0.3\times10^2 \Omega/\square$ or less, or $0.2\times10^2 \Omega/\square$ or less. Optionally, the second thin film formed (or source electrode and drain electrode layer) has an oxygen content that is at least 0.5%, for example, at least 1%, 3%, 5%, 8%, 12%, 15%, or 20%, lower than the stoichiometric content.

Optionally, the thin-film transistor of the present disclosure includes an active layer, a source electrode, and a drain electrode, in which a material of the source electrode and the drain electrode as well as the active layer is a mixture of indium gallium tin oxide and indium oxide, and the molar content of indium in the mixture is 50 mol % or more, or even 75 mol % or more; and the oxide of the mixture after forming the source electrode and the drain electrode is oxygen-deficient with respect to the stoichiometric oxide. For example, it overall lacks at least 0.5 mol % of oxygen, optionally at least 1 mol %, 3 mol %, 5 mol %, 8 mol %, 12 mol % of oxygen; optionally at least 15 mol % of oxygen, and even at least 20 mol % of oxygen. Optionally, the metal oxide after forming the source electrode and the drain electrode contains the incorporated H atoms. Optionally, with respective to the total number of atoms of the metal oxide, it contains at least 0.01 mol % of H atoms; optionally contains at least 0.05 mol % of H atoms, and even contains at least 0.1 mol % of H atoms. Optionally, the amount of H atoms contained does not exceed 2 mol %.

Based on the same inventive concept, the thin-film transistor of the present disclosure is prepared by a same metal oxide material in a same film forming chamber. In the process of preparing the source electrode and the drain electrode, it is only necessary to adjust the oxygen content in the film forming atmosphere, so that the obtained thin film satisfies the square resistance requirements of the source electrode and the drain electrode. This solves the problem that the metal oxide of the related art has low conductivity and thus is difficult to act as a material for the source electrode and the drain electrode to replace the metal material.

According to still another aspect of the present disclosure, the present disclosure also provides a display substrate, including the thin-film transistor described above.

According to still another aspect of the present disclosure, the present disclosure also provides a display device including the above display substrate.

The detailed description of the present disclosure will be further described in detail below with reference to the drawings and specific examples. The following specific examples are merely used to illustrate the disclosure, but are not intended to limit the scope of the disclosure.

In the embodiment, the bottom gate type thin-film transistor is taken as an example to specifically introduce the technical solution of the present disclosure. It should be noted that the technical solution of the present disclosure is not limited to a bottom gate type thin-film transistor, and is also applicable to a top gate type thin-film transistor and a coplanar type thin-film transistor.

Figure 2:
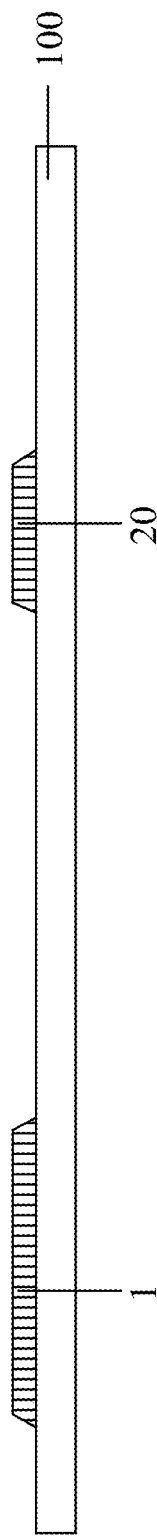
Figure 3:
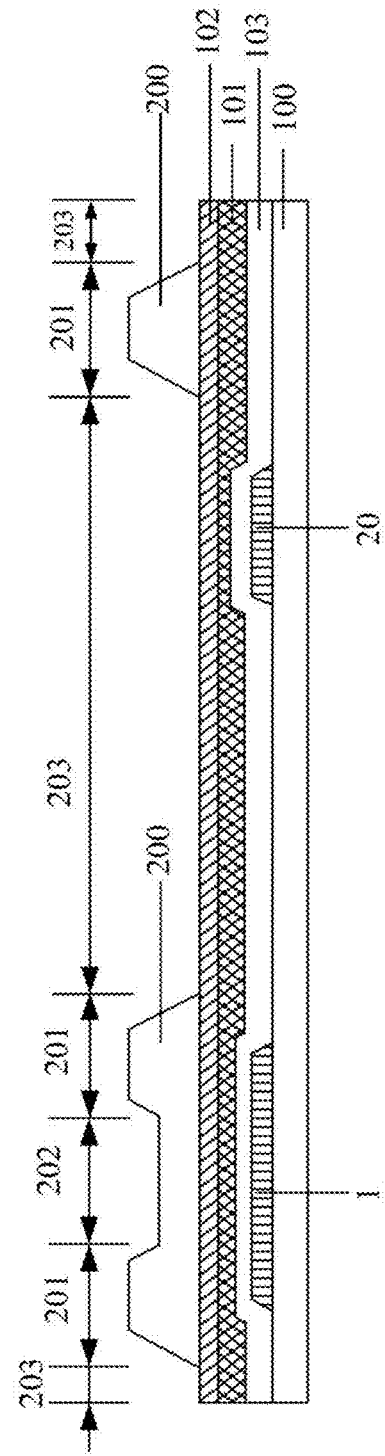
Figure 4:
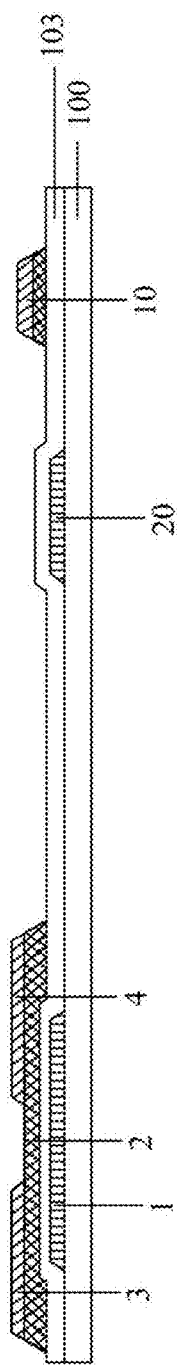

Referring to FIGS. 2 to 4, an embodiment of the present disclosure provides a method for preparing a thin-film transistor, the method including the following steps S1 to S4.

Step S1: a substrate 100 is provided. When applied to the display product, the substrate 100 is a transparent substrate, such as a quartz substrate, a glass substrate, an organic resin substrate or the like.

Step S2: a gate metal thin film is formed on the substrate 100 by using a gate metal, and the gate metal thin film is patterned to form a gate electrode 1, as shown in FIG. 2. Specifically, a gate metal material may be sputtered on the substrate 100 by using a magnetron sputtering apparatus to form a gate metal thin film. The material of the gate metal may be a metal, such as Cu, Al, Ag, Mo, Cr, Nd, Ni, Mn, Ti, Ta, and W, or an alloy of these metals. It may be a single-layer structure or a multi-layer structure. The multi-layer structure is, for example, Cu\Mo, Ti\Cu\Ti, Mo\Al\Mo, or the like. The gate metal film may have a thickness ranging from 3000 Å to 4000 Å.

Step S3: a gate insulating layer 103 covering the gate electrode 1 is formed, as shown in FIG. 3. The gate insulating layer 103 may be a single layer or a composite layer structure made from an insulating material, such as silicon nitride, silicon oxide or silicon oxynitride. Specifically, the gate insulating layer 103 is formed by plasma enhanced chemical vapor deposition, and may have a thickness ranging from 3000 Å to 5000 Å.

Step S4: an active layer 2, a source electrode 3 and a drain electrode 4 are formed on a surface of the gate insulating layer 103 away from the gate electrode 1, and the source electrode 3 and the drain electrode 4 are overlapped on the surface of the active layer 2 away from the gate electrode 1, as shown in FIG. 4. The materials of the active layer 2 as well as the source electrode 3 and the drain electrode 4 are selected from a metal oxide material.

Figure 9:
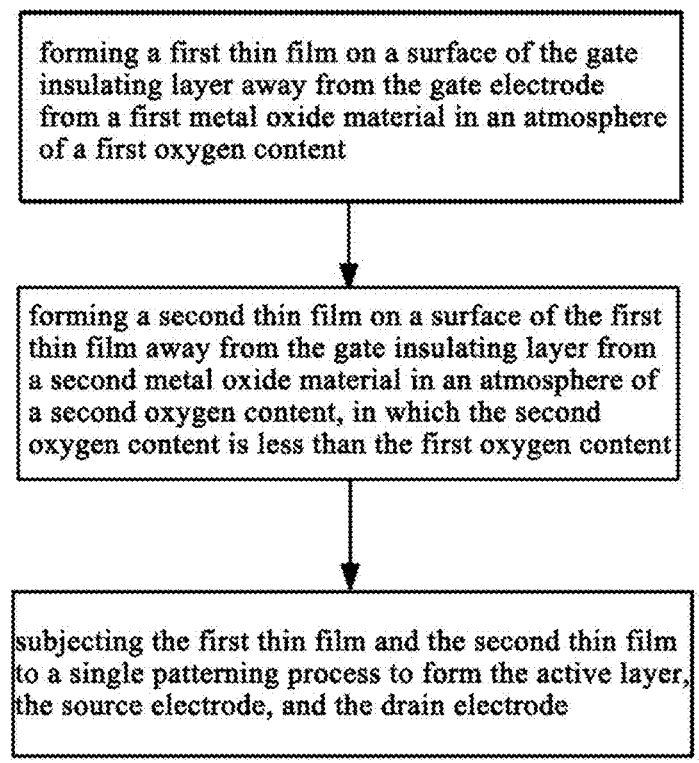
FIG. 9 is a flow chart showing the formation of an active layer, a source electrode, and a drain electrode according to an embodiment of the present disclosure.

Referring to FIGS. 2 and 9, the step of forming the active layer 2, the source electrode 3, and the drain electrode 4 on the surface of the gate insulating layer 103 away from the gate electrode 1 includes: forming a first thin film 101 on a surface of the gate insulating layer 103 away from the gate electrode from a first metal oxide material in an atmosphere of a first oxygen content; forming a second thin film 102 on a surface of the first thin film 101 away from the gate insulating layer 103 from a second metal oxide material in an atmosphere of a second oxygen content, in which the second oxygen content is less than the first oxygen content; and subjecting the first thin film 101 and the second thin film 102 to a single patterning process to form the active layer 2, the source electrode 3, and the drain electrode 4.

In the process of preparing the source electrode and the drain electrode, the above method reduces the oxygen content of the metal oxide material at the time of film formation, thereby reducing the sheet resistivity of the film formed. Further, the second metal oxide film satisfies the requirements of the conductivity of the source electrode and the drain electrode, whereby the source electrode and the drain electrode of the thin-film transistor can be formed from the metal oxide. Since the same metal oxide material is used, the source electrode and the drain electrode as well as the active layer can be prepared from a same film forming chamber. This increases production efficiency and reduces production cost. Moreover, by simultaneously forming the source electrode, the drain electrode, and the active layer by a single patterning process, the production efficiency can be further improved, and the production cost can be reduced.

In the above preparation method, referring to FIG. 3 and FIG. 4, the step of subjecting the first thin film 101 and the second thin film 102 to perform the single patterning process to form the source electrode 3, the drain electrode 4 and the active layer 2 may specifically include: coating a photoresist 200 on the second thin film 102, and exposing and developing the photoresist 200 to form a photoresist completely reserved region 201, a photoresist partially reserved region 202, and a photoresist non-reserved region 203, in which the photoresist completely reserved region 201 corresponds to a region where the source electrode 3 and the drain electrode 4 are located, the photoresist partially reserved region 202 corresponds to a region between the active layers 2, and the photoresist non-reserved region 203 corresponds to other regions; removing the first thin film and the second thin film of the photoresist non-reserved region 203; removing the photoresist on the photoresist reserved region 202 by an ashing process, and then removing the second thin film on the photoresist reserved region 201; and stripping a remaining photoresist to form the active layer 2, the source electrode 3, and the drain electrode 4.

In this embodiment, both the first metal oxide material and the second metal oxide material may include a mixture of indium gallium tin oxide and indium oxide. In the process of forming the first thin film and the second thin film by the film forming process, it is only necessary to adjust the oxygen content, and it is not necessary to replace the target, which is advantageous for improving the production efficiency. In addition, the second metal oxide material is selected from a mixture including indium gallium tin oxide and indium oxide, because the indium content is high and the mobility is higher, which is advantageous for obtaining a lower square resistance, thereby satisfying the conductive performance requirements of the source electrode and the drain electrode and being capable of improving the performance of thin-film transistors.

Optionally, the first thin film may have a thickness ranging from 300 Å to 500 Å.

When the first metal oxide material and the second metal oxide material both include a mixture of indium gallium tin oxide and indium oxide, the first thin film and the second thin film are etched by using $H_2SO_4 + HNO_4$ due to the high indium content, and the etch rate is 3 Å/S to 3.6 Å/S.

Of course, the first metal oxide material and the second metal oxide material may also be selected from other metal oxide materials. The first metal oxide material and the second metal oxide material may also be selected from different metal oxide materials.

Optionally, the second oxygen content is set to be less than or equal to 30%. Optionally, the second oxygen content is set to be less than or equal to 25% (v/v), 20% (v/v), 15% (v/v), 10% (v/v), 5% (v/v), 3% (v/v), or 1% (v/v). It is even possible to optionally set the second oxygen content to be zero. Since the lower the oxygen content is, the smaller the square resistance of the formed second thin film is, the smaller the square resistance of the source electrode and the drain electrode made by the second thin film is, thereby being capable of better satisfying the conductivity performance requirements of the source electrode and the drain electrode.

In an optional embodiment, the step of forming the source electrode, the drain electrode, and the active layer further includes: subjecting the first thin film to an annealing process at a first temperature, and subjecting the second thin film to an annealing process at a second temperature, in which the first temperature and the second temperature may be different. By subjecting the first thin film and the second thin film to an annealing process at different temperatures, the above steps can further adjust the square resistance of the first thin film and the second thin film to satisfy the electrical conductivity requirements of the semiconductor and the conductive material, respectively.

Optionally, the first temperature may be in the range of 300° C. to 420° C.

Figure 10:
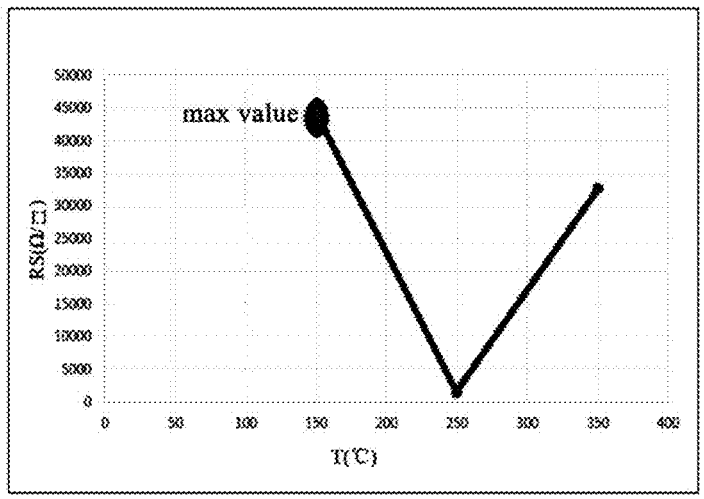
FIG. 10 is a schematic view showing the relationship between the annealing temperature and the square resistance of the second thin film prepared when the second oxygen content is 30% and the thickness of the second thin film is 700 Å in an embodiment of the present disclosure.

A suitable temperature may be selected for annealing process according to the second oxygen content and the second thin film thickness of the second thin film, such that the square resistance of the second thin film satisfies the conductive performance requirements of the source electrode and the drain electrode. For example, when the second oxygen content is 30%, the thickness of the second thin film is greater than or equal to 700 Å. Further, the annealing process of the second thin film is performed at a temperature of 250° C., such that the square resistance of the second thin film is on an order of magnitude of $10^2$ or less, and satisfies the electrical conductivity requirements of the source electrode and the drain electrode, as shown in FIG. 10.

Figure 13:
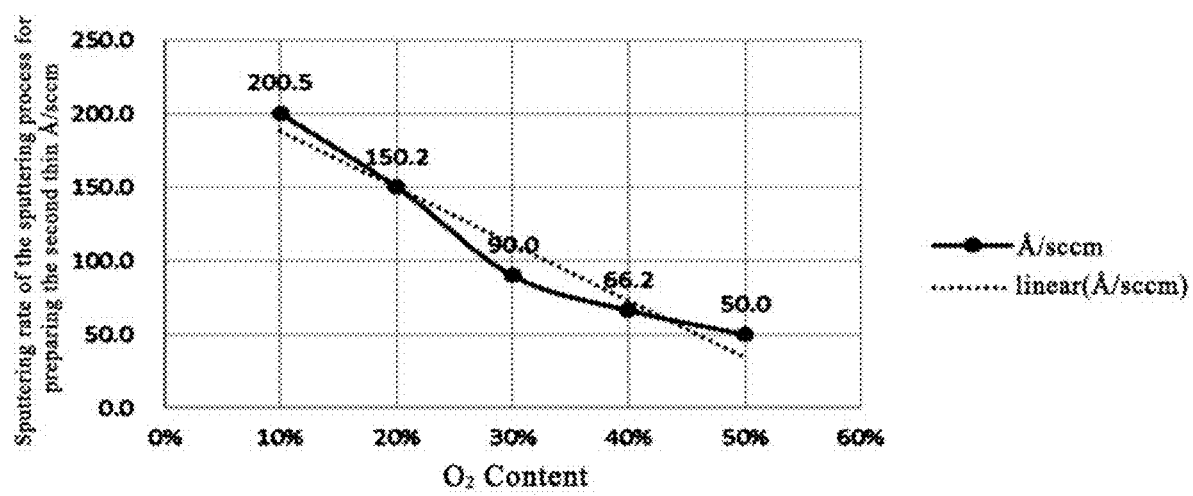
FIG. 13 is a graph showing the relationship between the second oxygen content and the sputtering rate of the sputtering process for preparing the second thin film in an embodiment of the present disclosure.

It is also possible to select an appropriate second temperature to subject the second thin film to an annealing process according to different oxygen content atmospheres, and thus to select the thickness of the second thin film to be greater than a certain set value, thereby satisfying the conductive performance requirements of the source electrode and the drain electrode. For example, when the second thin film is prepared by a sputtering process, the sputtering conditions are shown as follows, power: 3 KW; Ar pass rate: 50 sccm to 80 sccm; pressure: 0.3 Pa to 0.6 Pa; and $O_2$ input rate: 20 sccm. When the second thin film is annealed at a temperature of 250° C. and the thickness of the second thin film is about 700 Å, the square resistance of the second thin film prepared can satisfy the electrical conductivity requirements of the source electrode and the drain electrode. The relationship between the second oxygen content and the sputtering rate of the sputtering process for preparing the second thin film is shown by the solid line in FIG. 13. The broken line in FIG. 13 indicates the correspondence relationship between the second oxygen content and the sputtering rate of the sputtering process for preparing the second thin film satisfying a certain linear relationship.

In the present disclosure, an H atom-containing gas, such as water vapor and ammonia, may also be input to form the second thin film from the second metal oxide material in an atmosphere having the second oxygen content, and to reduce the square resistance of the second thin film, such that the conductive performance requirements of the source electrode and the drain electrode is satisfied.

Figure 11:
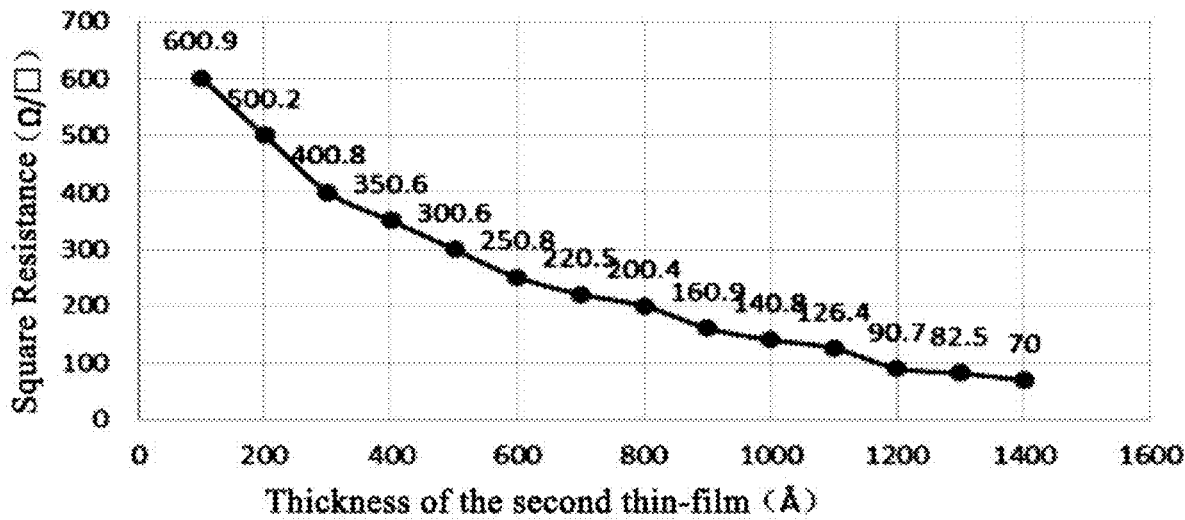
FIG. 11 is a view showing the relationship between the thickness and the square resistance of the second thin film prepared when the second oxygen content is 0 and the water vapor has an input rate of 1 sccm in an embodiment of the present disclosure.

Specifically, water vapor may be input to form the second thin film from the second metal oxide material in an oxygen-free atmosphere. The oxygen-free and water vapor atmosphere gases are more advantageous for achieving a second thin film having a smaller square resistance, thereby improving the conductivity of the source electrode and the drain electrode. The water vapor can be input at a rate greater than or equal to 1 sccm, and the second thin film can have a thickness greater than or equal to 1400 Å. For example, as shown in FIG. 11, in an oxygen-free atmosphere, that is, the case that the second oxygen content is 0, and in the situation that the water vapor is input at a rate of 1 sccm, the power of the sputtering film forming process is 3 KW. When the thickness of the second thin film is 1400 Å, the square resistance is 70$\Omega/\square$, which satisfies the conductive performance requirement of the transparent electrode. By increasing the velocity of water vapor and increasing the power, the square resistance of the second thin film meets the conductivity requirements of the source electrode and the drain electrode.

According to still another aspect of the present disclosure, the present disclosure also provides a thin-film transistor prepared by the above method. The materials of the active layer, the source electrode and the drain electrode of the thin-film transistor prepared are a metal oxide material, and the square resistance of the source electrode and the drain electrode is less than the square resistance of the active layer. Since the source electrode and the drain electrode as well as the active layer are made of a same metal oxide material, they can be made in a same film forming chamber. In the process of preparing the source electrode and the drain electrode, it is only necessary to adjust the oxygen content in the film forming atmosphere, so that the obtained thin film satisfies the square resistance requirements of the source electrode and the drain electrode, thereby improving the mass production efficiency and reducing the production costs.

As shown in FIG. 1 and FIG. 5 to FIG. 8, when the technical solution of the present disclosure is applied to a display substrate, the method for preparing the display substrate includes: preparing a thin-film transistor by the above method, and simultaneously forming a gate line (not shown) and a common signal line 20 of the display substrate by a patterning process for preparing a gate electrode; and simultaneously preparing a data line 10 of the display substrate by a patterning process for preparing the source electrode 3 and the drain electrode 4.

In an optional embodiment, the method for preparing the display substrate further includes the following steps S5-S8.

Figure 5:
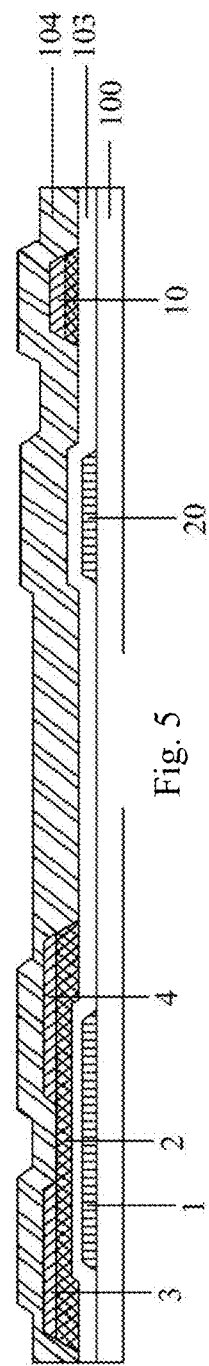

Step S5: As shown in FIG. 5, a passivation layer 104 and a planarization layer 105 covering the thin-film transistor are sequentially formed, and a first via hole 11, a second via hole 12, and a third via hole 13 are formed in the planarization layer 105 by a first etching process. The first via hole 11 is arranged to correspond to a region where the drain electrode 4 is located, the second via hole 12 is arranged to correspond to a region where the common signal line 20 is located, and the third via hole 13 is arranged to correspond to a region where the data line 10 is located. Then, the passivation layer 104 under the first via hole 11 is removed by a second etching process to expose the drain electrode 4; the passivation layer 104 under the second via hole 12 is removed to expose the common signal line 20; and the passivation layer 104 under the third via hole 13 is removed to expose the data line 10, as shown in FIGS. 6 and 7.

The passivation layer 104 may be $SiO_2$, SiON, SiN film layer or a combination thereof, and may have a thickness of 1500 Å to 3000 Å.

Specifically, the passivation layer 104 can be formed by a plasma enhanced chemical vapor deposition method, and an annealing process is performed in a temperature range of 250° C. to 350° C. to ensure characteristics of the TFT.

The planarization layer 105 may be made of an organic resin to provide a flat surface, and may have a thickness of 1.7 μm to 2.2 μm.

Step S6: a common electrode 6 and a connection electrode 7 is formed on the surface of the planarization layer 105 away from the passivation layer 104, the common electrode 6 is in electrical contact with the common signal line 20 through the second via hole 12, and the connection electrode 7 is in electrical contact with the data line 10 through the third via hole 13, as shown in FIGS. 6 and 7.

The common electrode 6 is made of a transparent metal oxide such as HIZO, ZnO, $TiO_2$, CdSnO, MgZnO, IGO, IZO, ITO or IGZO. When the first transparent conductive film for preparing the common electrode 6 is formed, the oxygen content in the film forming atmosphere can be reduced, to lower the square resistance of the common electrode 6, thereby satisfying the conductive performance requirement of the transparent electrode. The specific operating process conditions can be referred to the preparation process conditions of the source electrode and the drain electrode.

Optionally, the common electrode 6 may have a thickness of 400 Å to 700 Å.

Figure 8:
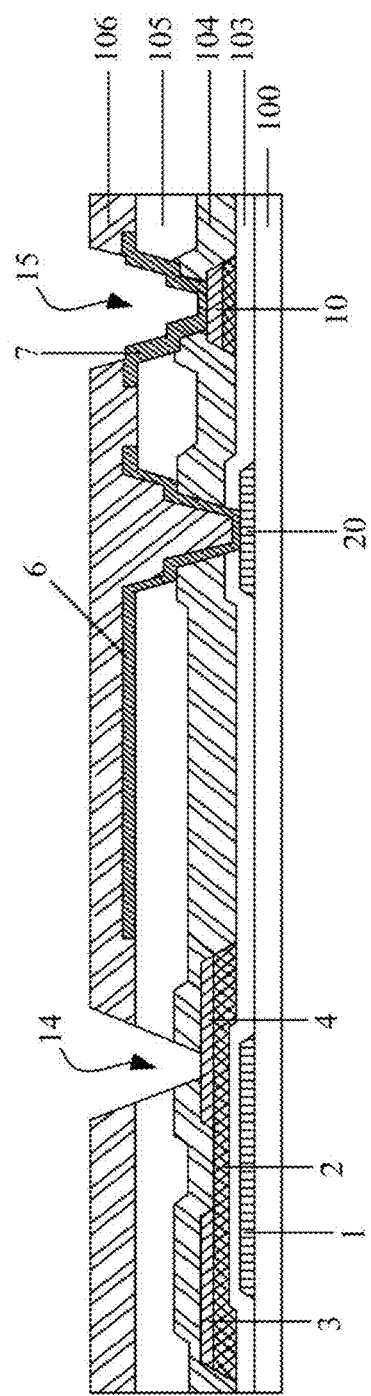

Step S7: an interlayer insulating layer 106 covering the common electrode 6 is formed, and by a second etching process, a fourth via hole 14 is formed in the interlayer insulating layer 106 to expose the drain electrode 4 while a fifth via hole 17 is formed in the interlayer insulating layer 106 to expose the connection electrode 7, as shown in FIG. 8.

The interlayer insulating layer 106 may be $SiO_2$, SiON, SiN film layers or a combined film layer of these film layers, and has a thickness ranging from 1000 Å to 3000 Å.

Step S8: a pixel electrode 5 is formed on the interlayer insulating layer 106, the pixel electrode 5 is in electrical contact with the drain electrode 4 through the fourth via hole 14, the pixel electrode 5 is in electrical contact with the connection electrode 7 through the fifth via hole 15, and the pixel electrode 5 is electrically connected to the data line 10 through the connection electrode 7, as shown in FIG. 1.

The pixel electrode 5 is made from a transparent metal oxide, such as HIZO, ZnO, $TiO_2$, CdSnO, MgZnO, IGO, IZO, ITO or IGZO. When the first transparent conductive film for preparing the pixel electrode 5 is formed, the oxygen content in the film forming atmosphere can be reduced, to lower the square resistance of the pixel electrode 5, thereby satisfying the conductive performance requirement of the transparent electrode. Optionally, the pixel electrode 5 has a thickness of 400 Å to 700 Å.

So far, the production of the display substrate is completed.

In the optional preparation method, the transparent electrode (including the pixel electrode and the common electrode), the source electrode, the drain electrode and the active layer can share a same film forming chamber, which can greatly improve production efficiency and reduce production cost. In the process of preparing the transparent electrode, the source electrode and the drain electrode, it is only necessary to adjust the oxygen content in the film forming atmosphere, so that the obtained thin film satisfies the square resistance requirements of the transparent electrode, the source electrode and the drain electrode.

The materials of the transparent electrode, the source electrode, the drain electrode and the active layer of the display substrate prepared by the above method are all metal oxide materials, so that each layer can be made in a same film forming chamber. When the display device is the display substrate described above, the mass production efficiency of the display device can be improved and the production cost can be reduced.

The above description is merely the optional embodiment of the present disclosure. It should be noted that one skilled in the art would make several improvements and substitutions without departing from the principles of the present disclosure. These improvements and modifications should also be regarded as the protection scope of the present disclosure.

What is claimed is:

1. A method for preparing a thin-film transistor, comprising a step of forming a source electrode, a drain electrode, and an active layer; and a step of forming a passivation layer covering the source electrode, the drain electrode and the active layer, wherein the step of forming the source electrode, the drain electrode, and the active layer comprises:
   forming a first thin film from a first metal oxide material in an atmosphere with a first oxygen gas content of a volume percentage;
   forming a second thin film from a second metal oxide material in an atmosphere with a second oxygen gas content of a volume percentage; and
   performing an annealing process on the first thin film at a first temperature and performing an annealing process on the second thin film at a second temperature,
   wherein the first thin film is configured to form the active layer, the second thin film is configured to form the source electrode and the drain electrode, the first oxygen gas content and the second oxygen gas content are measured under the same condition with respect to a total volume of a reaction chamber for forming the first thin film and the second thin film, and the second oxygen gas content is less than the first oxygen gas content,
   wherein the passivation layer is directly in physical contact with the source electrode, the drain electrode and the active layer,
   wherein the first temperature ranges from 300° C. to 420° C. and the second temperature ranges from 240° C. to 260° C., and
   wherein said forming the source electrode, the drain electrode and the active layer comprises:
   forming the second thin film on the first thin film; and
   subjecting the first thin film and the second thin film to a single patterning process to form the source electrode, the drain electrode, and the active layer.

2. The method of claim 1, wherein the second oxygen gas content is 30%, and the second thin film has a thickness greater than or equal to 700 Å.

3. The method of claim 1, wherein the step of forming the second thin film from the second metal oxide material in the atmosphere with the second oxygen gas content comprises: introducing an H atom-containing gas to form the second thin film from the second metal oxide material in an atmosphere having the second oxygen gas content greater than 0.

4. The method of claim 3, wherein the H atom-containing gas is one or more selected from the group consisting of water vapor and ammonia.

5. The method of claim 4, wherein the H atom-containing gas is water vapor, and the water vapor has an input rate greater than or equal to 1 sccm.

6. The method of claim 1, wherein the first thin film and the second thin film are formed in the reaction chamber and using a same target by a sputtering process.

7. The method of claim 6, wherein both the first metal oxide material and the second metal oxide material comprise an indium gallium tin oxide, and a molar content of indium in the first metal oxide material and the second metal oxide material are greater than or equal to 50 mol %.

8. The method of claim 1, wherein said subjecting the first thin film and the second thin film to perform the single patterning process to form the source electrode, the drain electrode and the active layer comprises:
   coating a photoresist on the second thin film, and exposing and developing the photoresist to form a photoresist completely reserved region, a photoresist partially reserved region, and a photoresist non-reserved region, wherein the photoresist completely reserved region corresponds to a region where the source electrode and the drain electrode are located, the photoresist partially reserved region corresponds to a part of a region where the active layer is located, and the photoresist non-reserved region corresponds to other regions;
   removing the first thin film and the second thin film of the photoresist non-reserved region;
   removing the photoresist on the photoresist partially reserved region by an ashing process, and then removing the second thin film on the photoresist partially reserved region; and
   stripping a remaining photoresist to form the active layer, the source electrode, and the drain electrode.

* * * * *